United States Patent [19]

Yamaguchi et al.

[11] Patent Number: 4,803,461
[45] Date of Patent: Feb. 7, 1989

[54] R-2R TYPE D/A CONVERTER CIRCUIT

[75] Inventors: Akira Yamaguchi, Yokohama; Toshimasa Kawaai, Tokyo, both of Japan

[73] Assignee: Kabushiki Kaisha Toshiba, Kawasaki, Japan

[21] Appl. No.: 97,105

[22] Filed: Sep. 16, 1987

[30] Foreign Application Priority Data

Sep. 16, 1986 [JP] Japan .................. 61-217515

[51] Int. Cl.$^4$ ............................................. H03M 1/12
[52] U.S. Cl. ....................................... 341/154; 341/118
[58] Field of Search ................. 340/347 DA, 347 CC, 340/347 M

[56] References Cited

U.S. PATENT DOCUMENTS 4,532,494  7/1985  Sasaki et al. .................. 340/347

OTHER PUBLICATIONS

Harris Semiconductor Product Catalog (Jul. 1977).

*Primary Examiner*—William M. Shoop, Jr.
*Assistant Examiner*—Richard K. Blum
*Attorney, Agent, or Firm*—Finnegan, Henderson, Farabow, Garrett, & Dunner

[57] ABSTRACT

The R-2R type D/A converter comprises an R-2R type D/A converter circuit provided with first and second series circuits each comprising a resistor and a switch. The first series circuit is connected between one end of a ladder resistor circuit and the ground. The second series circuit is connected between the other end of the ladder resistor circuit and the ground. The switches in the first and second series circuits are selectively turned on/off, so that an output signal may be supplied in either direction. First and second analog circuits are connected one to each terminal of the R-2R type D/A converter circuit. By turning on/off the switches of the first and second series circuits, a D/A converted output signal may be supplied selectively to the first or second analog circuit. Since the switches of the first and second series circuits are not located in the analog signal line, the D/A converted output signal can be supplied selectively to the two analog circuits, in a time-sequential manner, without adversely affecting an analog output signal of the R-2R type D/A converter circuit.

4 Claims, 3 Drawing Sheets

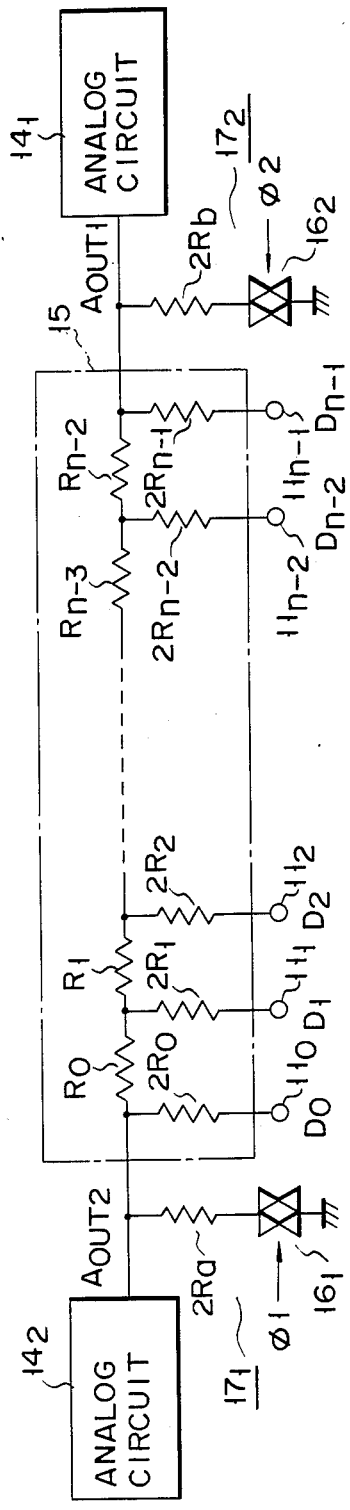
F I G. 3
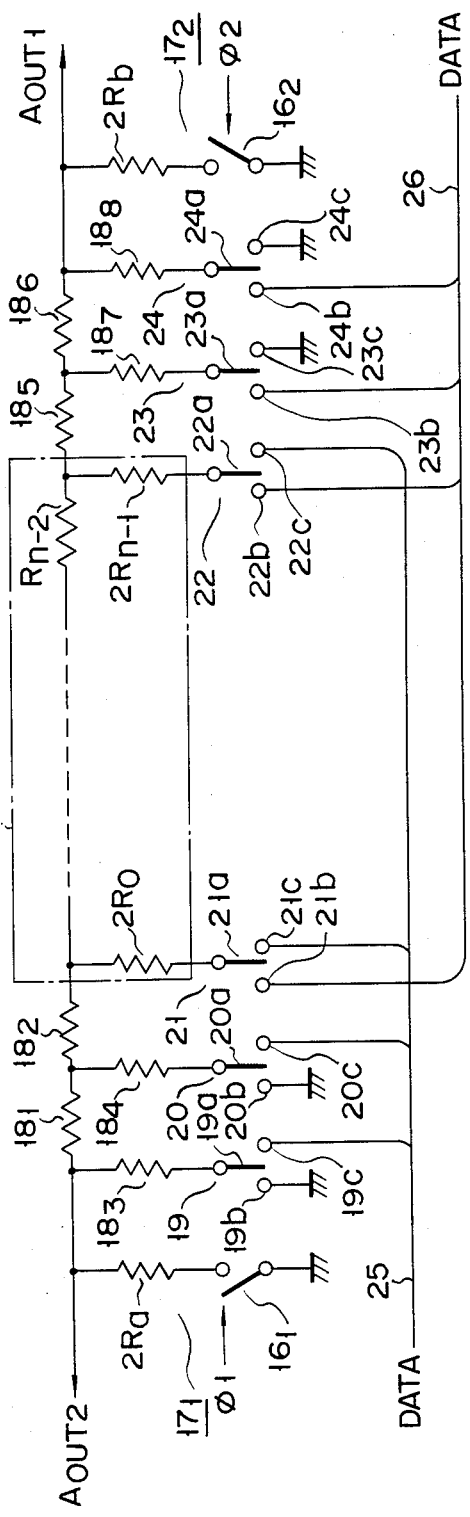
F I G. 4

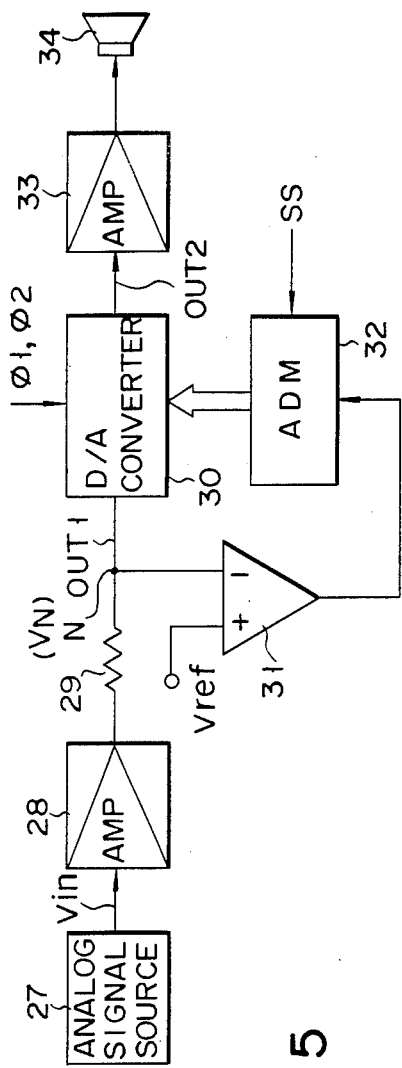
F I G. 5
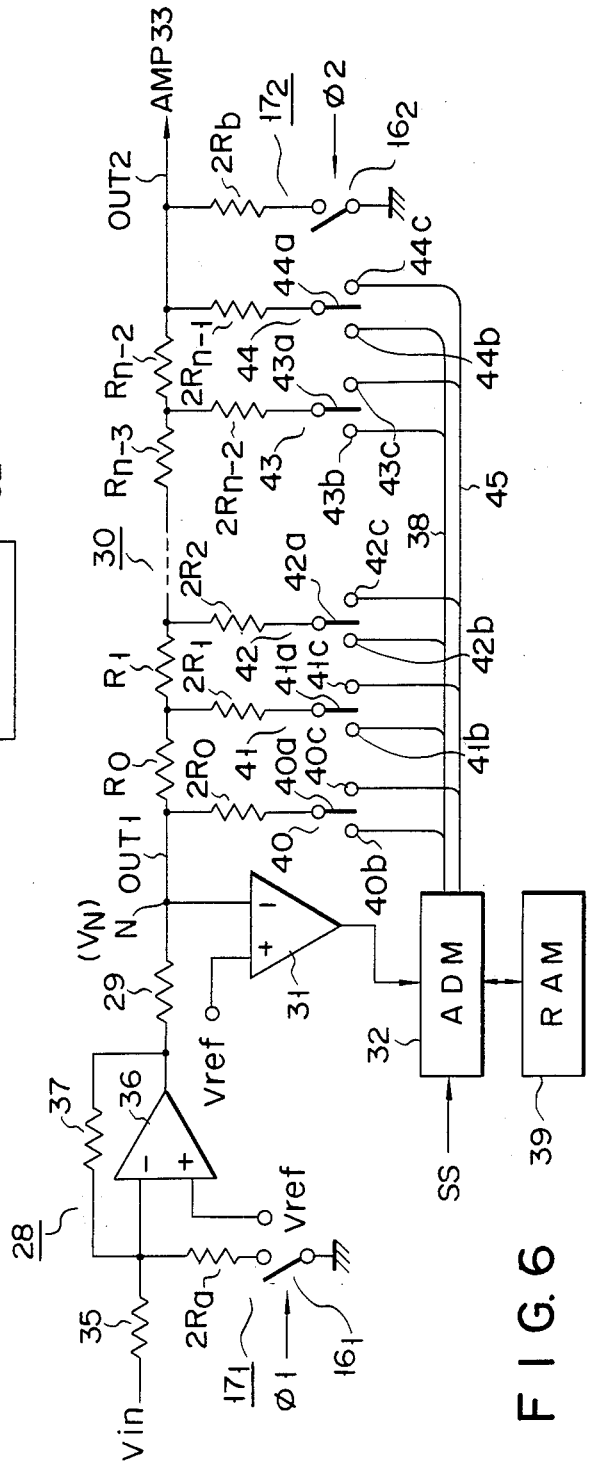
F I G. 6

R-2R TYPE D/A CONVERTER CIRCUIT

BACKGROUND OF THE INVENTION

The present invention relates to an R-2R type D/A converter circuit which is used commonly in two different circuits, in a time-sequential manner, and is suitable as an analog signal source for these two circuits.

FIG. 1 shows a conventional R-2R type D/A converter circuit of n-bit construction.

In this Figure, digital input terminals $11_0$ to $11_{n-1}$, which receive sequentially weighted n-bit digital signals $D_0$ to $D_{n-1}$, are connected to first ends of resistors $2R_0$ to $2R_{n-1}$. Resistors $R_0$ to $R_{n-2}$ are connected between second ends of resistors $2R_0$ to $2R_{n-1}$. Resistor $2R$ is connected between a junction of resistors $2R_0$ and $R_0$ and the ground. Analog signal Aout, which corresponds to digital signals $D_0$ to $D_{n-1}$, is output from a junction of resistors $2R_{n-1}$ and $R_{n-2}$. The resistance value of each of resistors $2R$ and $2R_0$ to $2R_{n-1}$ is twice that of each of resistors $R_0$ to $R_{n-2}$.

The D/A converter as shown in FIG. 1 is combined with two analog circuits, as shown in FIG. 2, in which an output signal of the D/A converter is selectively supplied to the two analog circuits. An input terminal of D/A converter circuit 12 receives n-bit digital signals $D_0$ to $D_{n-}$. An output terminal of D/A converter circuit 12 is connected to first ends of first and second switches (e.g., analog switches) $13_1$ and $13_2$. The second ends of switches $13_1$ and $13_2$ are connected to input terminals of first and second analog circuits $14_1$ and $14_2$. Switches $13_1$ and $13_2$ are turned on/off by complementary logic level signals 1 and 2, so that output signal $A_{out}$ of D/A converter circuit 12 is fed selectively to analog circuit $14_1$ or to analog circuit $14_2$. Switches $13_1$ and $13_2$ are employed in order to eliminate the following problem:

In the case where, for example, the input impedance of analog circuit $14_1$ is higher than the output impedance of D/A converter circuit 12, while the input impedance of analog circuit $14_2$ is lower than the output impedance of D/A converter circuit 12, if the output terminal of D/A converter circuit 12 is connected directly to the input terminals of analog circuits $14_1$ and $14_2$, output signal $A_{out}$ of D/A converter circuit 12 is adversely affected by analog circuit $14_2$. Namely, by electrically separating the input terminals of analog circuits $14_1$ and $14_2$ by using switches $13_1$ and $13_2$, output signal $A_{out}$ of D/A converter circuit 12 is protected against the influence of analog circuit $14_2$.

The level of analog signal $A_{out}$, however, varies in accordance with the digital input. Thus, if each switch $13_1$, $13_2$ is constituted by a transfer gate in which P-channel type MOS transistor and N-channel type MOS transistor are connected in parallel, the impedance of each MOS transistor is varied by a backgate bias effect, so that analog signal $A_{out}$ output from D/A converter circuit 12 is adversely affected.

Alternatively, a multiplexer is used to select one of the two analog circuits. Since, however, a multiplexer is generally constituted by an active element, the input impedance is varied non-linearly, in accordance with a voltage applied to the multiplexer. Therefore, the analog signal fed from the D/A converter circuit is also adversely affected.

As stated above, in the case where an output signal of a conventional R-2R type D/A converter circuit is supplied to two analog circuits, in a time-sequential manner, then a switch or multiplexer must be provided in an analog signal line. The presence of this switch or multiplexer, however, adversely affect an output analog signal of the analog circuit system.

SUMMARY OF THE INVENTION

The present invention has been developed in consideration of the above circumstances, and has as its object to provide an R-2R type D/A converter which can supply a D/A converted output to two different analog circuits, in a time-sequential manner, without adversely affecting an output analog signal.

An R-2R type D/A converter circuit according to the present invention comprises an R-2R type ladder resistor circuit which receives a digital signal; a first series circuit, connected between one terminal of the ladder resistor circuit and the ground, and provided with a first resistor and a first switch which are series-connected; a second series circuit, connected between the other terminal of the ladder resistor circuit and the ground, and provided with a second resistor and a second switch which are series-connected, and signal means for selectively turning on and off the first and second switches, and obtaining an analog output signal from one of the terminals of the ladder resistor circuit, which is located on the side where one of the first and second switches is turned off.

In order to achieve the above object, the R-2R type D/A converter circuit is provided with first and second series circuits each comprising a resistor and a switch. The first series circuit is connected between one end of a ladder resistor circuit and the ground. The second series circuit is connected between the other end of the ladder resistor circuit and the ground. The switches in the first and second series circuits are selectively turned on/off, so that an output signal may be supplied in either direction.

First and second analog circuits are connected one to each output terminal of the R-2R type D/A converter circuit. By turning on/off the switches of the first and second series circuits, a D/A converted output signal may be supplied selectively to the first or second analog circuit. Since the switches of the first and second series circuits are not located in the analog signal line, the D/A converted output signal can be supplied selectively to the two analog circuits, in a time-sequential manner, without adversely affecting an analog output signal of the R-2R type D/A converter circuit.

BRIEF DESCRIPTION OF THE DRAWINGS

FIG. 3 shows a circuit configuration of an R-2R type D/A converter circuit according to an embodiment of the present invention;

FIG. 4 shows a circuit configuration of an R-2R type D/A converter circuit according to another embodiment of the present invention;

FIG. 5 shows a circuit configuration of an analog signal comparison circuit including the D/A converter circuit of FIG. 3 or FIG. 4; and FIG. 6 shows a detailed circuit configuration of the comparison circuit of FIG. 5.

DETAILED DESCRIPTION OF PREFERRED EMBODIMENTS

Figure 1:
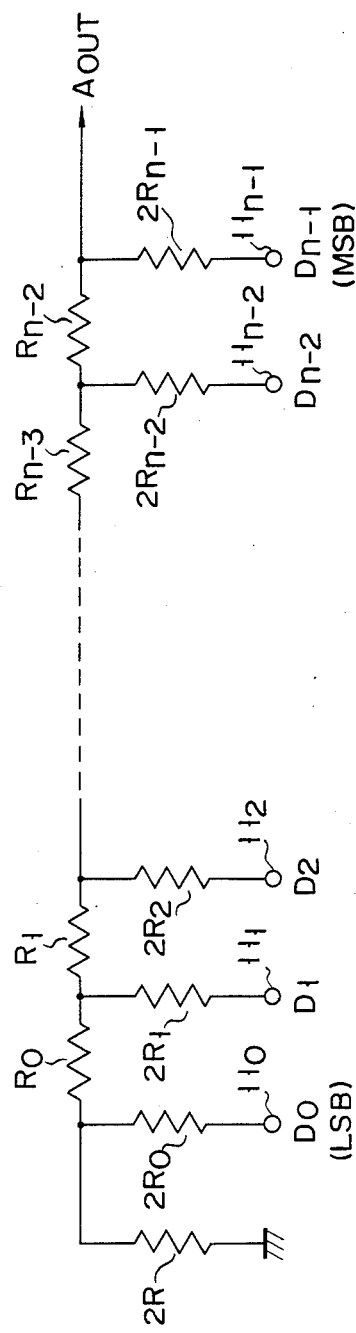
FIG. 1 shows a circuit configuration of a conventional R-2R type D/A converter circuit.
Figure 2:
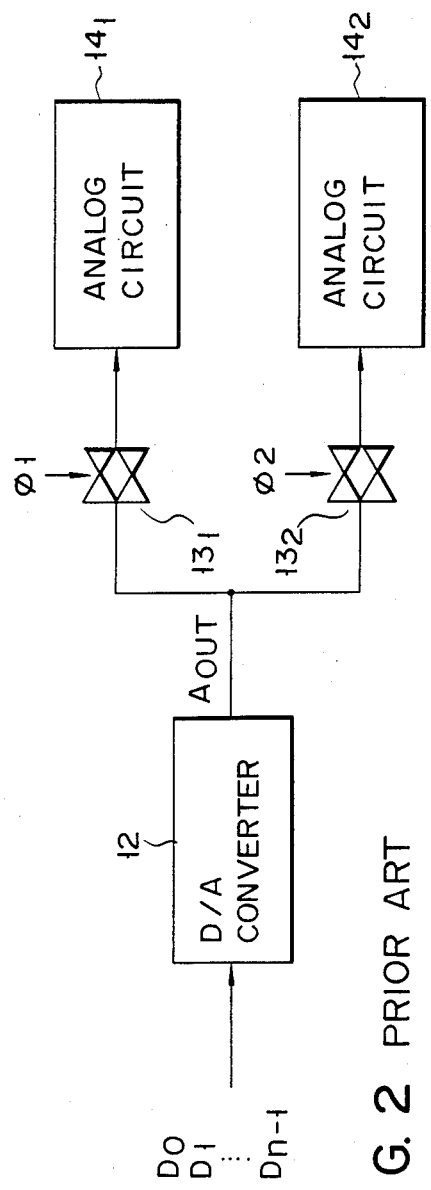
FIG. 2 is a block diagram of the D/A converter circuit of FIG. 1, which supplies an analog signal to two different analog circuits in a time-sequential manner.

An embodiment of the present invention will now be described with reference to the accompanying drawings.

FIG. 3 show an R-2R type D/A converter of an n-bit construction, according to an embodiment of the invention. Resistors $2R_0$ to $2R_{n-1}$ and Resistors $R_0$ to $R_{n-2}$ constitute ladder resistor circuit 15. Digital input terminals $11_0$ to $11_{n-1}$, to which sequentially weighted n-bit digital signals $D_0$ to $D_{n-1}$ are supplied, are connected to first ends of resistors $2R_0$ to $2R_{n-1}$. Resistors $R_0$ to $R_{n-2}$ are connected between second ends of adjacent resistors $2R_0$ to $2R_{n-1}$. First series circuit $17_1$, including resistor $2R_a$ and switch (e.g., analog switch) $16_1$, is connected between a ground terminal and a junction of resistors $R_0$ and $2R_0$ of ladder resistor circuit 15. Second series circuit $17_2$, including resistor $2R_b$ and switch (e.g., analog switch) $16_2$, is connected between a ground terminal and a junction of resistors $R_{n-2}$ and $2R_{n-1}$ of ladder resistor group 15. Switches $16_1$ and $16_2$ are turned on/off by complementary logic level signals $\phi 1$ and $\phi 2$. The on/off states of switches $16_1$ and $16_2$ determine the direction of output signals. That is, D/A converted output signal $A_{out1}$ or $A_{out2}$, corresponding to input digital signals $D_0$ to $D_{n-1}$, is selectively fed to analog circuit $14_1$ or $14_2$ via the junction of resistors $R_{n-2}$ and $2R_b$ or the junction of resistors $R_0$ and $2R_a$. Analog circuit $14_1$ is selected when signal $\phi 1$ is at "H" level and signal $\phi 2$ is at "L" level, and analog circuit $14_2$ is selected when signal $\phi 1$ is at "L" level and signal $\phi 2$ is at "H" level.

Suppose that signal $\phi 1$ is at "H" level and signal $\phi 2$ is at "L" level, and switch $16_1$ is turned on and switch $16_2$ is turned off. At this time, analog circuit $14_1$ is selected. Since switch $16_2$ is turned off, switch $16_2$ and resistor $2R_b$ does not adversely affect a D/A converted output signal of D/A converter 15. Accordingly, D/A converted output signal $A_{out1}$, which is free from fluctuation due to the switch circuit, can be supplied to analog circuit $14_1$ from D/A converter 15.

Then, suppose that signal $\phi 2$ is at "H" level and signal $\phi 1$ is at "L" level, and switch $16_2$ is turned on and switch $16_1$ is turned off. At this time, analog circuit $14_2$ is selected. Since switch $16_1$ is turned off, switch $16_1$ and resistor $2R_a$ does not affect a D/A converted output signal of D/A converter 15. Thus, D/A converted output signal $A_{out2}$, which is free from fluctuation due to the switch circuit, can be supplied to analog circuit $14_2$ from D/A converter 15.

Since switches $16_1$ and $16_2$ do not exist in an analog signal line, an impedance variation due to back-gate bias effect can be prevented even if the level of analog signal $A_{out1}$ or $A_{out2}$ varies. Accordingly, a variation in the switching impedance neither distorts an analog signal fed to analog circuit $14_1$ or $14_2$, nor changes the time constant.

In the above embodiment, switches $16_1$ and $16_2$ are connected between the ground terminal and resistors $2R_a$ and $2R_b$, respectively However, it is possible to connect switch $16_1$ between resistor $2R_a$ and analog circuit $14_2$, and switch $16_2$ between resistor $2R_b$ and analog circuit $14_1$. In this case, if MOS transistors are used in switches $16_1$ and $16_2$, the impedance of the switch is increased by the back-gate bias effect. However, if a power supply voltage is sufficiently high, there is no problem.

FIG. 4 shows another embodiment of the present invention. In the circuit construction shown in FIG. 3, though a D/A converted output signal, which is free from distortion and time constant variation, can be fed to the selected analog circuit, an analog signal is undesirably fed to the non-selected analog circuit. In the embodiment of FIG. 4, the level of the undesired analog signal is decreased, and a digital input signal can be supplied selectively from two circuits In FIG. 4, the reference numerals in FIG. 3 are also used. Resistors $18_1$ to $18_8$ constitute an R-2R type resistor circuit which provides redundant bits for decreasing the level of an undesired analog signal fed from the non-selected circuit. Resistors $18_1$, $18_2$, $18_5$, and $18_6$ have the same resistance value as resistors $R_0$ to $R_{n-2}$, and resistors $18_3$, $18_4$, $18_7$, and $18_8$ have the same resistance value as resistors $2R_a$, $2R_b$, and $2R_0$ to $2R_{n-1}$. Resistors $18_1$ to $18_4$ constitute a two-stage ladder resistor circuit, and are connected between an output terminal of D/A converter 15 for outputting signal $A_{out2}$ and switch circuit $17_1$. Also, resistors $18_5$ to $18_8$ constitute a two-stage ladder resistor circuit, and are connected between an output terminal of D/A converter 15 for outputting signal $A_{out1}$ and switch circuit $17_2$. First ends of resistors $18_3$ and $18_4$ are connected to movable contacts $19a$ and $19b$ of switches 19 and 20. Fixed contacts $19b$ and $20b$ of switches 19 and 20 are connected to ground terminals, an other fixed contacts $19c$ and $20c$ are connected to data bus 25.

First ends of resistors $2R_0$ and $2R_{n-1}$ of ladder resistor group 15 are connected to movable contacts $21a$ and $22a$ of switches 21 and 22. Fixed contacts $21b$ and $22b$ of switches 21 and 22 are connected to data bus 26, and fixed contacts $21c$ and $22c$ are connected to data bus 25. Though not shown, switches are provided in the same manner for resistors $2R_2$ to $2R_{n-2}$. First ends of resistors $18_7$ and $18_8$ are connected to movable contacts $23a$ and $24a$ of switches 23 and 24. Fixed contacts $23b$ and $24b$ of switches 23 and 24 are connected to data bus 26, and fixed contacts $23c$ and $24c$ are connected to ground terminals.

When signal $\phi 1$ is at "H" level and signal $\phi 2$ is at "L" level, and switch $16_1$ is turned on and switch $16_2$ is turned off, movable contacts $19_a$ to $24a$ of switches 19 to 24 are connected to fixed contacts $19b$ to $24b$ by control signals (not shown). On the other hand, when signal $\phi 1$ is at "L" level and signal $\phi 2$ is at "H" level, and switch $16_1$ is turned off and switch $16_2$ is turned on, movable contacts $19a$ to $24a$ of switches 19 to 24 are connected to fixed contacts $19c$ to $24i$ c by control signals (not shown).

The operation of the second embodiment will now be described.

Suppose that signal $\phi 1$ is at "H" level and signal $\phi 2$ is at "L" level, and switch $16_1$ is turned on and switch $16_2$ is turned off. In this case, movable contacts $19a$ to $24a$ of switches 19 to 24 are connected to fixed contacts $19b$ to $24b$. Digital data fed from bus line 26 are D/A converted by the circuit including resistor circuit 15 and resistors $18_1$ to $18_8$. Since switch $16_2$ is turned off, the switch circuit does not adversely affect analog signal $A_{out1}$. Accordingly, analog signal $A_{out1}$, which is free from fluctuation, is supplied from D/A converter 15 to analog circuit $14_1$. Since the first ends of resistors $18_3$ and $18_4$ are connected to the ground terminal through switches 19 and 20, respectively, an undesired analog signal to be output to non-selected analog circuit $14_2$ is divided and decreased by resistors $18_1$ to $18_4$.

On the other hand, if signal φ2 is at "H" level and signal φ1 is at "L" level, and switch $16_2$ is turned on and switch $16_1$ is turned off, movable contacts 19a to 24a of switches 19 to 24 are connected to fixed contacts 19c to 24c. Digital data fed from bus line 25 are D/A converted by the circuit including resistor circuit 15 and resistors $18_1$ to $18_8$. In this case, since switch $16_1$ is turned off, the switch circuit does not adversely affect analog signal $A_{out2}$. Accordingly, analog signal $A_{out2}$, which is free from fluctuation, is supplied from D/A converter 15 to analog circuit $14_2$. Since the first ends of resistors $18_7$ and $18_8$ are connected to the ground terminal through switches 23 and 24, respectively, an undesired analog signal to be output to non-selected analog circuit $14_1$ is divided and decreased by resistors $18_5$ to $18_8$.

As stated above, in the embodiment of FIG. 4, a D/A converted output signal is supplied to the selected analog circuit, and an undesired analog signal to be fed to another analog circuit can be reduced. In addition, digital inputs can be fed from two circuits via data buses 25 and 26, selectively. Although, in the second embodiment, the redundant four bits formed by resistors $18_1$ to $18_8$ are provided, the number of redundant bits is not limited, and can be freely chosen. The larger the number of redundant bits, the greater the effect. However, the number of redundant bits should be suitably chosen in consideration of total characteristics (distortion, resolution) of the circuit.

FIG. 5 shows an example of a voice synthesizer using ADM (Adaptive Delta Modulation), to which the D/A converter shown in FIGS. 3 and 4 is applied. In FIG. 5, analog voltage signal source 27, for example, a microphone, receives a voice signal, and supplies analog voltage signal Vin to amplifier 28. An output terminal of amplifier 28 is connected to one end of resistor 29. The other end of resistor 29 is connected to one output terminal OUT1 of D/A converter 30 and also to an inverting input terminal (−) of comparator 31. Resistance value of resistor 29 is selected to be equal to an impedance $Z_{D/A}$ of D/A converter 30 as viewed from output terminal OUT1 into the inside thereof. Analog voltage signal $V_N$, which is determined by an estimated analog voltage signal fed from terminal OUT1 of D/A converter 30 and analog voltage signal Vin from amplifier 28, is supplied to the inverting input terminal (−) of comparator 31. D/A converter 30, which comprises an R-2R ladder-type resistor circuit, supplies the estimated output analog signal of the input analog signal Vin, from one of two output terminals, selectively, based on a control signal. Reference voltage Vref is applied to a non-inverting input terminal (+) of comparator 31. Comparator 31 compares analog voltage signal $V_N$ with the reference voltage Vref. The comparison data is fed to ADM (Adaptive Delta Modulation) circuit 32. ADM circuit 32 is supplied with an initial voltage signal SS used as an initially estimated analog voltage signal. A digital voltage signal of ADM circuit 32, which is representative of the result of the arithmetic operation, is fed to D/A converter 30. The other output terminal OUT2 of D/A converter 30 is connected to amplifier 33. Speaker 34 is connected to amplifier 33 as a load.

The operation of the comparator circuit of FIG. 5 will now be described. ADM circuit 32 is supplied with an initial voltage signal SS used as an initially estimated analog voltage signal. Input analog voltage signal Vin from analog voltage signal source 27 is amplified by amplifier 28. The amplified voltage signal is fed to node N through resistor 28 having a resistance value equal to the impedance of D/A converter 30 as viewed from output terminal OUT1. Node N also receives the estimated analog voltage signal from terminal OUT1 of D/A converter 30. Voltage $V_N$ at node N determined by input analog voltage signal Vin from amplifier 28 and the estimated analog voltage signal from terminal OUT1 of D/A converter 30. Voltage $V_N$ is applied to the inverting input terminal (−) of comparator 31. The non-inverting input terminal (+) of comparator 31 receives reference voltage Vref. Comparator 31 compares voltage $V_N$ with reference voltage Vref and produces a comparison data. ADM circuit 32 receives the comparison data from comparator 31 and carries out an arithmetic operation to determine an estimated value of the input analog voltage signal Vin. The result of the arithmetic operation is fed to D/A converter 30. The reference voltages for amplifier 28, comparator 31, ADM circuit 32, and D/A converter 30 are equal, though not shown. The output voltage signal of amplifier 28, which corresponds to the input analog voltage signal Vin, and the output voltage signal of D/A converter 30, which corresponds to the estimated analog voltage signal, are made to have the opposite polarities in relation to reference voltage Vref. If the estimation by ADM circuit 32 is correct, voltage $V_N$ at node N becomes equal to reference voltage Vref, and only has a DC component. In fact, however, factors of the D/A converter, such as resolution and arithmetic operation precision, make voltage $V_N$ at node N differ from reference voltage Vref. As a result, voltage $V_N$ at node N1 includes error component ΔV, and becomes to (Vref±ΔV). Therefore, the estimated analog voltage signal from ADM circuit 32 is not taken out of node N. In order to take out the estimated analog voltage signal, D/A converter 30 is controlled by a control signal so as to produce the estimated analog voltage signal from terminal OUT2. The signal from terminal OUT2 is amplified by amplifier 33, and fed to speaker 34. Thus, the estimated analog voltage signal (e.g., voice synthesis signal), which corresponds to the output value of ADM circuit 32, can be obtained.

In the above embodiment of FIG. 5, an estimated analog voltage signal can be obtained without having to employ two D/A converters. Further, analog signals can be compared irrespective of the dynamic range of the comparator. It is, therefore, not necessary to increase the pattern area. Since the level of an input analog voltage level need not be specified in consideration of the dynamic range of the comparator, the S/N ratio and resolution of the circuit are not deteriorated.

FIG. 6 shows a concrete structure of the circuit of FIG. 5. The same numerals as used in FIG. 5 indicate the same elements. Analog voltage signal Vin is fed from analog voltage signal source 27 (not shown in FIG. 6) to an inverting input terminal (−) of operational amplifier 36 through resistor 35. Resistor $2R_a$ and switch $16_1$ are series-connected between the inverting input terminal (−) of operational amplifier 36 and the ground. Reference voltage Vref is applied to a non-inverting input terminal (+) of operational amplifier 36. An output terminal of operational amplifier 36 is connected to one end of resistor 29 and also to the inverting input terminal (−) through resistor 37. Resistors 35 and 37 and operational amplifier 36 constitutes amplifier 28 shown in FIG. 5. The other end of resistor 29 is connected to an inverting input terminal (−) of comparator 31 and also to output terminal OUT1 of R-2R ladder-type resistor circuit (constituting D/A converter 30) comprising resistors R0 to Rn−2 and resistors 2R0 to 2Rn−1. Reference voltage Vref is applied to a non-inverting input terminal (+) of comparator 31. An output voltage signal of comparator 31 is fed to ADM circuit 32. The result of the arithmetic operation performed by ADM circuit 32 is fed to n-bit data bus 38, and is also stored in RAM (random access memory) 39. Movable contacts 40a to 44a of switches 40 to 44 are connected to first contacts of resistors 2R0 to 2Rn−1. First stationary contacts 40b to 44b of switches 40 to 44 are commonly connected to bus 38 of ADM circuit 32, and second stationary contacts 40c to 44c are commonly connected to n-bit data bus 45 of ADM circuit 32. A node between resistor Rn−2 and 2Rn−1 is grounded through resistor $2R_b$ and switch $16_2$. The sum of the resistances of resistors 29, 35, $2R_a$, and 37 is set to 2R.

The comparator circuit shown in FIG. 6 operates as follows. Switches $16_1$ and $16_2$ are alternately turned on/off by a control signal in order to switch the output terminals from which D/A converter 30 supplies an output signal. Suppose that switch $16_2$ is turned on and switch $16_1$ is turned off, and that movable contacts 40a to 44a of switches 40 to 44 are connected to stationary contacts 40b to 44b. In this case, the estimated digital voltage signal, fed from ADM circuit 32 through bus 38, is converted by D/A converter 30 into the estimated analog voltage signal. Voltage $V_N$ at node N is compared with reference voltage Vref by comparator 31. The comparison data is fed to ADM circuit 32. ADM circuit 32 performs an arithmetic operation for determining an estimated voltage value of input analog voltage signal Vin. Then, ADM circuit 32 produces a digital voltage signal indicative of the estimated value. This digital signal is fed to D/A converter 30 and, simultaneously, stored in RAM 39.

When the estimated analog voltage signal is to be taken out, switch $16_1$ is turned on and switch $16_2$ is turned off. Furthermore, movable contacts 40a to 44a are connected to stationary contacts 40c to 44c so that data stored in RAM 39 is supplied to contacts 40a to 44a via data bus 45. D/A converter 30 outputs an estimated analog voltage signal from terminal OUT2. The estimated analog voltage signal is amplified by amplifier 33 (not shown in FIG. 6) and supplied to speaker 34 (not shown in FIG. 6). Speaker 34 is driven by the estimated analog voltage signal, thus producing a synthesis output corresponding to the estimated analog voltage signal. In order to eliminate the influence of the output of operational amplifier 36 upon the synthesis output, it is desirable to keep high the impedance of the output terminal of operational amplifier 36 by using a power down signal.

The present invention can provide an R-2R type D/A converter which can supply an D/A converted output signal to two different analog circuits in a time-sequential manner, without adversely affecting the analog signal.

What is claimed:

1. An R-2R type D/A converter circuit comprising:
   an R-2R type ladder resistor circuit which receives a digital signal, said R-2R type ladder resistor circuit having two output terminals located at two corresponding respective sides of the R-2R ladder type resistor circuit;
   a first series circuit, connected between one output terminal of said ladder resistor circuit and the ground, and provided with a first resistor and a first switch which are series-connected;
   a second series circuit, connected between the other output terminal of said ladder resistor circuit and the ground, and provided with a second resistor and a second switch which are series-connected; and
   signal means for selectively turning on a selected one of said first and second switches, and for obtaining an analog signal from one of said two output terminals of said ladder resistor circuit, located on the side of said ladder resistor circuit corresponding to the other one of said first and second switches which is turned off.

2. An R-2R type D/A converter circuit according to claim 1, wherein said ladder resistor circuit is provided with a first redundant bit circuit, for dividing and decreasing the potential of said one terminal of said ladder resistor circuit when the first switch is turned on, and with a second redundant bit circuit, for dividing and decreasing the potential of said other terminal of the ladder resistor circuit when the second switch is turned on.

3. An R-2R type D/A converter circuit according to claim 1, wherein said first and second switches are analog switches.

4. An R-2R type D/A converter circuit according to claim 2, wherein said first and second redundant bit circuits are formed of R-2R type resistor circuits.

* * * * *